United States Patent
Wagner et al.

(10) Patent No.: US 12,021,350 B2
(45) Date of Patent: Jun. 25, 2024

(54) EDGE-EMITTING SEMICONDUCTOR LASER

(71) Applicant: OSRAM Opto Semiconductors GmbH, Regensburg (DE)

(72) Inventors: Jan Wagner, Regensburg (DE);
Werner Bergbauer, Windberg (DE);
Christoph Eichler, Donaustauf (DE);
Alfred Lell, Maxhütte-Haidhof (DE);
Georg Brüderl, Burglengenfeld (DE);
Matthias Peter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 519 days.

(21) Appl. No.: 17/289,124

(22) PCT Filed: Nov. 12, 2019

(86) PCT No.: PCT/EP2019/081009
§ 371 (c)(1),
(2) Date: Apr. 27, 2021

(87) PCT Pub. No.: WO2020/104251
PCT Pub. Date: May 28, 2020

(65) Prior Publication Data
US 2022/0013990 A1 Jan. 13, 2022

(30) Foreign Application Priority Data
Nov. 19, 2018 (DE) .......................... 102018129051.9

(51) Int. Cl.
*H01S 5/40* (2006.01)
*H01S 5/343* (2006.01)

(52) U.S. Cl.
CPC ........ *H01S 5/4031* (2013.01); *H01S 5/34333* (2013.01)

(58) Field of Classification Search
CPC .. H01S 5/3201; H01S 5/3215; H01S 5/32341; H01S 5/34333; H01S 5/4031
See application file for complete search history.

(56) References Cited

U.S. PATENT DOCUMENTS 6,252,894 B1 6/2001 Sasanuma et al.
6,388,275 B1 5/2002 Kano
(Continued)

FOREIGN PATENT DOCUMENTS

CN 1578029 A 2/2005
CN 105580146 A 5/2016
(Continued)

*Primary Examiner* — Michael Carter
(74) *Attorney, Agent, or Firm* — Slater Matsil, LLP

(57) ABSTRACT

In an embodiment an edge-emitting semiconductor laser includes a semiconductor layer sequence having a waveguide region with an active layer disposed between a first waveguide layer and a second waveguide layer and a layer system arranged outside the waveguide region configured to reduce facet defects in the waveguide region, wherein the layer system includes one or more layers with the material composition $Al_xIn_yGa_{1-x-y}N$ with $0 \leq x \leq 1$, $0 \leq y < 1$ and $x+y \leq 1$, wherein at least one layer of the layer system includes an aluminum portion $x \leq 0.05$ or an indium portion $y \geq 0.02$, wherein a layer strain is at least 2 GPa at least in some areas, and wherein the semiconductor layer sequence is based on a nitride compound semiconductor material.

19 Claims, 10 Drawing Sheets

(56) References Cited

U.S. PATENT DOCUMENTS

| | | |
|---|---|---|
| 6,775,314 B1 | 8/2004 | Waldrip et al. |
| 6,872,967 B2 | 3/2005 | Kano et al. |
| 7,177,336 B2 | 2/2007 | Taneya et al. |
| 7,817,692 B2 | 10/2010 | Matsumura et al. |
| 10,164,408 B2 | 12/2018 | Takayama |
| 10,535,793 B2 | 1/2020 | Jain et al. |
| 2001/0035531 A1* | 11/2001 | Kano ............... H01S 5/32341 257/190 |
| 2002/0094002 A1* | 7/2002 | Amano ............. H01S 5/34333 372/45.01 |
| 2003/0173560 A1 | 9/2003 | Kano et al. |
| 2004/0264533 A1 | 12/2004 | Matsumura et al. |
| 2005/0226295 A1 | 10/2005 | Taneya et al. |
| 2007/0145406 A1 | 6/2007 | Han et al. |
| 2012/0205619 A1 | 8/2012 | Gaska et al. |
| 2015/0083994 A1 | 3/2015 | Jain et al. |
| 2015/0229104 A1* | 8/2015 | Takayama ............ H01S 5/0206 372/45.012 |
| 2018/0109076 A1* | 4/2018 | Takayama ............ H01S 5/2206 |

FOREIGN PATENT DOCUMENTS

| | | |
|---|---|---|
| CN | 107615602 A | 1/2018 |
| EP | 1018770 A1 | 7/2000 |
| JP | H1168158 A | 3/1999 |
| JP | 2001274096 A | 10/2001 |
| JP | 2005033099 A | 2/2005 |
| WO | 03085790 A1 | 10/2003 |
| WO | 2016199363 A1 | 12/2016 |

* cited by examiner

EDGE-EMITTING SEMICONDUCTOR LASER

This patent application is a national phase filing under section 371 of PCT/EP2019/081009, filed Nov. 12, 2019, which claims the priority of German patent application 102018129051.9, filed Nov. 19, 2018, each of which is incorporated herein by reference in its entirety.

TECHNICAL FIELD

This application relates to an edge-emitting semiconductor laser.

BACKGROUND

Edge-emitting semiconductor lasers comprise a laser resonator extending parallel to the layer planes of the semiconductor layer sequence, wherein the laser facets are formed by side edges of the semiconductor layer sequence. The laser facets are typically fabricated by scribing and breaking.

When the laser facets are fabricated by scribing and breaking, there is a risk that facet defects may occur at interfaces of the epitaxially deposited semiconductor layers that comprise different strains. In particular, so-called transverse facets can form at the fracture edges that form the laser facets. These are areas of the fracture edge that are not exactly perpendicular to the layer planes as desired. For example, such a transverse facet can form a step at the fracture edge. Facet defects, such as transverse facets in particular, reduce the quality of the laser facets. This can lead to an increase in the temperature of the laser facet as well as a reduction in the efficiency and stability of the edge-emitting semiconductor laser. Furthermore, facet defects can cause inhomogeneities in the far field of the semiconductor laser, which are a disadvantage especially in laser-based projection applications.

SUMMARY

Embodiments provide an edge-emitting semiconductor laser having an improved laser facet quality.

According to at least one embodiment, the edge-emitting semiconductor laser comprises a semiconductor layer sequence based on a nitride compound semiconductor material. "Based on a nitride compound semiconductor material" in the present context means that the semiconductor layer sequence or at least one layer thereof comprises a III-nitride compound semiconductor material, preferably $Al_xIn_yGa_{1-x-y}N$, with $0 \leq x \leq 1$, $0 \leq y \leq 1$ and $x+y \leq 1$. In this context, this material need not necessarily comprise a mathematically exact composition according to the above formula. Rather, it may comprise one or more dopants as well as additional constituents. For the sake of simplicity, however, the above formula includes only the essential components of the crystal lattice (In, Al, Ga, N), even if these may be replaced in part by small amounts of other substances.

Laser diodes based on a nitride compound semiconductor are particularly suitable for emitting radiation in the spectral range of ultraviolet, blue or green light, depending on the material composition.

According to one embodiment, the edge-emitting semiconductor laser comprises a waveguide region with an active layer disposed between a first waveguide layer and a second waveguide layer.

The waveguide region may be arranged between a first cladding layer and a second cladding layer, wherein the cladding layers comprise a lower refractive index than the waveguide layers, thereby causing waveguiding of the laser radiation generated in the active layer in the waveguide region. For example, the first waveguide layer and the second waveguide layer may comprise InGaN. The indium content in the waveguide layers decreases the band gap and increases the refractive index. This is advantageous to achieve a high refractive index contrast to the cladding layers, which comprise for example AlGaN or GaN.

The active layer can be formed, for example, as a pn junction, a double heterostructure, a single quantum well structure or a multiple quantum well structure. The term quantum well structure includes any structure in which charge carriers undergo quantization of their energy states by confinement. In particular, the term quantum well structure does not contain any indication of the dimensionality of the quantization. Thus, it includes inter alia quantum wells, quantum wires and quantum dots and any combination of these structures.

According to at least one embodiment, the semiconductor layer sequence comprises a layer system disposed outside the waveguide region to reduce facet defects in the waveguide region. The layer system contains one or more layers with the material composition $Al_xIn_yGa_{1-x-y}N$ with $0 \leq x \leq 1$, $0 \leq y < 1$ and $x+y \leq 1$, preferably at least one layer with $0 < x \leq 0.3$ and/or $0 < y < 0.1$. In the material system $Al_xIn_yGa_{1-x-y}N$, the lattice constant decreases when the aluminum content x is increased, so that a tensile strain can be generated with Al-containing $Al_xIn_yGa_{1-x-y}N$ layers. Furthermore, in the $Al_xIn_yGa_{1-x-y}N$ material system, an increase in the indium content y increases the lattice constant, so that a compressive strain can be generated with In-containing $Al_xIn_yGa_{1-x-y}N$ layers.

According to at least one embodiment, at least one layer of the layer system comprises an aluminum portion $x \geq 0.05$ or an indium portion $y \geq 0.02$. In this way, a tensile or compressive strain is generated in the layer system.

According to at least one embodiment, the layer strain in the layer system is at least 2 GPa, at least in some areas. The layer strain may comprise a positive or negative sign, i.e. a compressive or tensile strain. In particular, the edge-emitting semiconductor laser described herein makes use of the idea of arranging a layer system outside the waveguide region in which the material composition is chosen such that a larger layer strain is present than in the waveguide region. It has been found that facet defects such as, in particular, transverse facets can occur during the manufacture of the laser facets by scribing and breaking at interfaces where high layer strains exist. In particular, such facet defects occur at the interfaces of the semiconductor layer sequence where the layer strains are highest. According to the principle proposed herein, a layer strain that is at least 2 GPa and preferably greater than the highest layer strain in the waveguide region is generated outside the waveguide region in a targeted manner. If a facet defect occurs during scribing and breaking within the semiconductor layer sequence, it is very likely to occur in a region of the layer system that is arranged outside the waveguide region. In this way, the risk of a facet defect occurring in the waveguide region that reduces the quality of the laser facet in a region where laser radiation exits the edge-emitting semiconductor laser is advantageously reduced. Rather, the layer strain generated in the layer system causes the risk of such facet defects to be shifted to an area that is arranged outside the waveguide region.

Due to the high layer strain, the layer system also has the property that it can prevent crystal defects, in particular facet defects, that propagate in the semiconductor layer sequence from propagating. Such facet defects can bend at an interface with a high layer strain in a direction parallel to the interface and thus no longer propagate in the vertical direction. In this way, the risk of such facet defects propagating into the waveguide region is reduced, and in particular, horizontally extending facet defects in the active region are avoided.

According to at least one embodiment, the layer system comprises one or more layers, each of which is at least 10 nm, preferably at least 20 nm and particularly preferably at least 30 nm thick. Preferably, the layer system comprises one or more layers that are each at least 10 nm, preferably at least 20 nm and particularly preferably at least 30 nm thick. These thicknesses are advantageous for achieving the desired high layer strain, in particular a layer strain of at least 2 GPa, since the layer strain increases with increasing layer thickness. For example, the layers of the layer system each comprise a thickness between 10 nm and 1 μm, preferably between 20 nm and 500 nm and particularly preferably between 30 nm and 200 nm.

According to at least one embodiment, a distance between the layer system and the active layer is at least 500 nm. Particularly preferably, the distance between the layer system and the active layer is at least 1 μm. By having a distance between the layer system and the active layer as large as possible, the risk of facet defects occurring in the optically active region of the edge emitting semiconductor laser is reduced.

According to at least one embodiment, a laser radiation propagating in the waveguide region comprises a maximum intensity $I_{max}$, wherein the intensity of the laser radiation in the layer system is not more than $0.2*I_{max}$. Preferably, the intensity of the laser radiation in the layer system is no more than $0.1*I_{max}$, and particularly preferably no more than $0.05*I_{max}$. In these cases, the layer system is advantageously so far away from the waveguide region that the intensity of the laser radiation is only 20%, only 10% or only 5% of the maximum value. If a facet defect occurs in the region of the layer system, this therefore has only a very small influence on the efficiency of the semiconductor laser.

According to at least one embodiment, the waveguide region is arranged between an n-type cladding layer and a p-type cladding layer. In particular, the n-type cladding layer, the first waveguide layer, the active layer, the second waveguide layer, and the p-type cladding layer are arranged in said order within the semiconductor layer sequence. This does not preclude arranging one or more additional layers between said layers. The cladding layers, the waveguide layers and the active layer may each be formed by a single layer or comprise a plurality of partial layers. Preferably, the n-type cladding layer faces a substrate of the semiconductor laser. Preferably, the substrate of the semiconductor laser is a GaN substrate. The layer system for reducing facet defects in the waveguide region is preferably arranged between the substrate and the n-type cladding layer.

When the layer system is arranged in this region, in particular outside the n-type cladding layer, the intensity of the laser radiation in the layer system is particularly low, so that any facet defect has only a very small effect on the efficiency of the semiconductor laser.

According to at least one embodiment, the layer system includes at least one $Al_xIn_yGa_{1-x-y}N$ layer that comprises an indium fraction $y \geq 0.03$. Preferably, $y \geq 0.05$, more preferably $y \geq 0.07$. The larger the indium fraction in the layer, the larger compressive strains can be generated. However, in order not to impair the crystal quality too much by incorporating indium into the crystal lattice, the indium fraction should not be too large, so that preferably $y \leq 0.1$. Preferably, in the indium-containing layer $x=0$, i.e., the layer is an $In_yGa_{1-y}N$ layer.

According to at least one embodiment, the layer system includes at least one $Al_xIn_yGa_{1-x-y}N$ layer that comprises an aluminum content $x \geq 0.1$. Preferably, $x \geq 0.15$, more preferably $x \geq 0.2$. The greater the aluminum content in the layer, the greater tensile strains can be generated. Preferably, in the aluminum-containing layer $y=0$, i.e. the layer is an $Al_xGa_{1-x}N$ layer.

According to at least one embodiment, the layer system comprises at least one $Al_xIn_yGa_{1-x-y}N$ layer that comprises a gradient of the indium portion and/or the aluminum portion. Such a gradient allows the layer strain to be continuously increased or decreased.

According to at least one embodiment, the layer system has at least one $Al_xGa_{1-x}N$ layer with $x>0$ and at least one $In_yGa_{1-y}N$ layer with $y>0$. The combination of at least one AlGaN layer and at least one InGaN layer makes it possible, in particular, to generate strains with opposite signs in the layer system. In a preferred embodiment, the AlGaN layer and the InGaN layer are directly adjacent to each other. In this way, it is particularly possible to generate an abrupt change in the layer strain in the layer system. At an interface where the layer strain changes abruptly, it is particularly likely that a facet defect will be redirected parallel to the interface.

According to at least one embodiment, the layer system comprises such a material composition that the layer strain in the layer system is greater than in the waveguide region. In this way, the risk of facet defects in the waveguide region is reduced.

According to at least one embodiment, the layer system comprises at least one interface at which the layer strain changes by more than 2 GPa. Such an interface, where the layer strain changes by at least 2 GPa, is particularly well suited to redirect a facet defect.

According to at least one embodiment, the layer system comprises at least one interface at which the layer strain changes from compressive strain to tensile strain or from tensile strain to compressive strain. For example, this interface may be an interface between an AlGaN layer and an InGaN layer.

According to at least one embodiment, the layer system comprises multiple alternating AlGaN layers and InGaN layers. In particular, the layer system may comprise a superlattice comprising a plurality of layer pairs of alternating AlGaN layers and InGaN layers. In such a layer system of alternating AlGaN layers and InGaN layers, there are multiple interfaces where the strain state changes. Such a layer system is particularly well suited to redirect facet defects.

According to at least one embodiment, the layer system comprises at least 3 and at most 100 layers. Increasing the number of interfaces where high strains occur can increase the likelihood that a facet defect will be redirected.

According to at least one embodiment, the semiconductor laser comprises a first laser facet and a second laser facet, wherein the first laser facet and the second laser facet do not comprise facet defects in the waveguide region.

The fact that the semiconductor laser is free of facet defects in the waveguide region is achieved in the edge-emitting semiconductor laser described herein, in particular, by the previously described layer system for reducing facet defects in the waveguide region.

According to at least one embodiment, the first laser facet or the second laser facet comprises a facet defect in the layer system region. This facet defect may be due to the layer strain generated in the layer system. In this case, this facet defect is present outside the waveguide region and is accepted to prevent a facet defect in the region of the waveguide region.

According to at least one embodiment, the semiconductor laser is a laser bar comprising a plurality of emitters arranged side by side. In a laser bar, preventing facet defects in the region of the waveguide region is particularly important because in a laser bar, failure of a single emitter can lead to failure of the entire laser bar.

According to at least one embodiment, the layer system is adjacent to a GaN layer. The GaN layer directly follows the layer system, in particular in the growth direction. The materials of the layer system are preferably chosen such that the bending induced by the entire layer system is zero.

BRIEF DESCRIPTION OF THE DRAWINGS

The edge-emitting semiconductor laser is explained in more detail below by means of exemplary embodiments in connection with FIGS. 1 to 26.

Components that are the same or have the same effect are each given the same reference signs in the figures. The components shown as well as the proportions of the components among each other are not to be regarded as true to scale.

DETAILED DESCRIPTION OF ILLUSTRATIVE EMBODIMENTS

Figure 1:
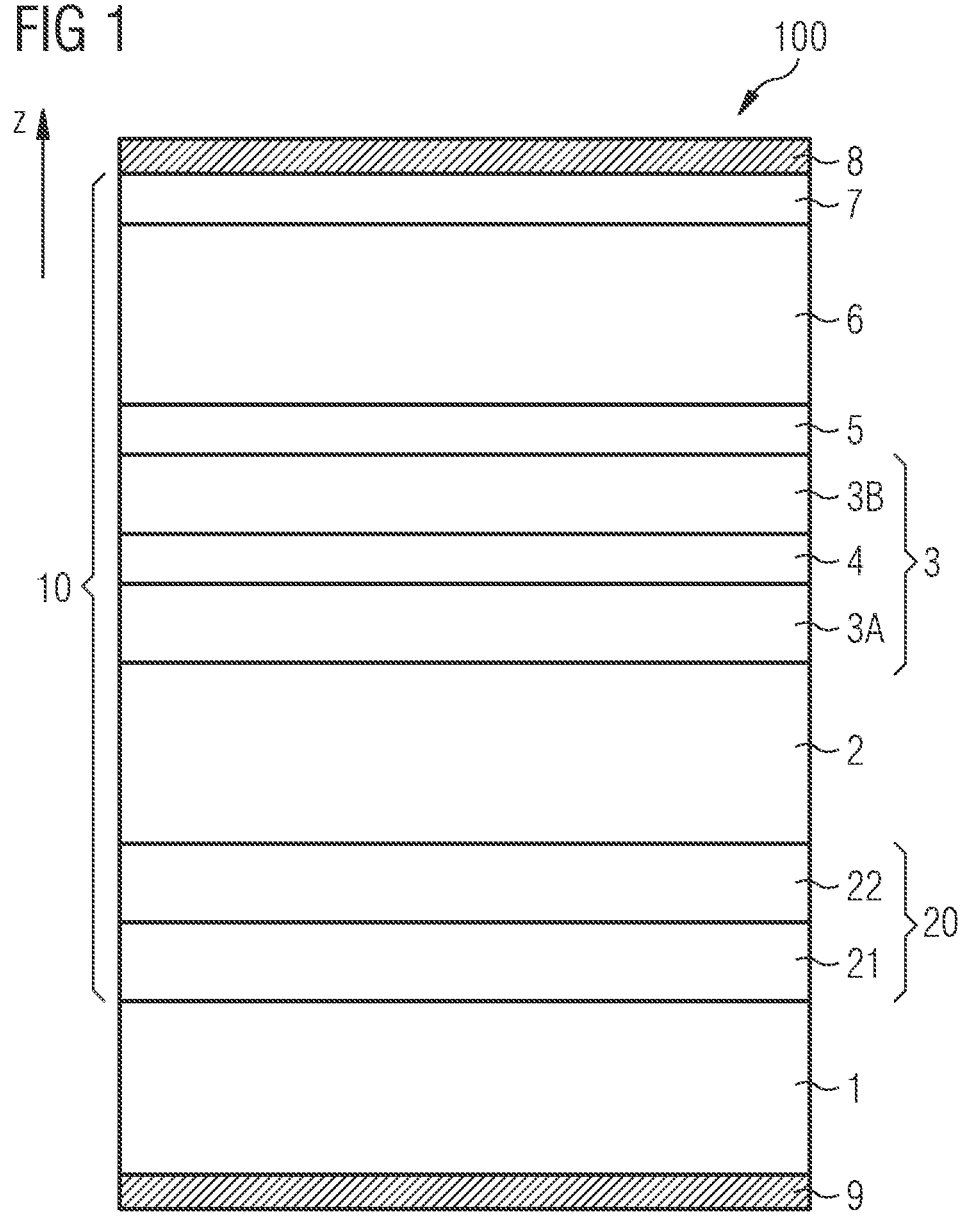
FIG. 1 shows a schematic representation of a cross-section through an edge-emitting semiconductor laser according to an exemplary embodiment.

FIG. 1 illustrates a cross-sectional view of an exemplary embodiment of the edge-emitting semiconductor laser 100. The edge-emitting semiconductor laser 100 comprises a semiconductor layer sequence 10 grown in a growth direction z on a substrate 1.

The semiconductor layer sequence 10 is based on a nitride compound semiconductor, that is, the semiconductor layers of the semiconductor layer sequence 10 comprise, in particular, $Al_xIn_yGa_{1-x-y}N$, wherein $0 \leq x \leq 1$, $0 \leq y \leq 1$ and $x+y \leq 1$. The substrate 1 is a substrate suitable for growing nitride compound semiconductors, preferably a GaN substrate.

To generate laser radiation, the edge-emitting semiconductor laser 100 includes an active layer 4, which is preferably formed as a single or multiple quantum well structure. The active layer 4 may comprise several partial layers, in particular a sequence of barrier layers and one or more quantum well layers, which are not shown individually in FIG. 1 for simplicity. The edge-emitting semiconductor laser 100 emits laser radiation perpendicular to the growth direction z, i.e. parallel to the layer plane of the active layer 4.

The active layer 4 is arranged between a first waveguide layer 3A and a second waveguide layer 3B, wherein the first waveguide layer 3A is adjacent to the active layer 4 at the n-side and the second waveguide layer 3B is adjacent to the active layer 4 at the p-side. The waveguide layers 3A, 3B may each be a single layer or comprise a plurality of partial layers. The first waveguide layer 3A and the second waveguide layer 3B, which are directly adjacent to the active layer 4, each comprise GaN or preferably InGaN. An indium content in the waveguide layers 3A, 3B decreases the band gap and increases the refractive index. In particular, the first and second waveguide layers may comprise $In_yGa_{1-y}N$ with $0.005 \leq y \leq 0.1$, preferably $In_yGa_{1-y}N$ with $0.02 \leq y \leq 0.07$, and particularly preferably $In_yGa_{1-y}N$ with $0.0 \leq y \leq 0.05$.

The active layer 4 and the waveguide layers 3A, 3B form a waveguide region 3. The waveguide region 3 is arranged between an n-type cladding layer 2 and a p-type cladding layer 6.

To guide the laser radiation in the waveguide region 3, the n-type cladding layer 2 and the p-type cladding layer 6 comprise a lower refractive index than the waveguide layers 3A, 3B. This is realized, for example, by the cladding layers 2, 6 comprising a higher aluminum content and/or lower indium content than the waveguide layers 3A, 3B, at least in some areas, resulting in a larger electronic bandgap and a lower refractive index. The n-type cladding layer 2 and the p-type cladding layer 6 may each be a single layer or comprise a plurality of partial layers.

In the exemplary embodiment of FIG. 1, an optional electron barrier layer 5 is arranged between the second waveguide layer 3B of the p-type cladding layer 6. The electron barrier layer 5 preferably comprises a larger aluminum content and, accordingly, an even larger band gap than the p-type cladding layer 6. In particular, the electron barrier layer 5 may comprise $Al_zGa_{1-z}N$, wherein the aluminum content z is between 0.05 and 0.4, preferably between 0.1 and 0.3, and particularly preferably between 0.15 and 0.25. The electron barrier layer 5 comprises a larger band gap Eg than the adjacent second waveguide layer 3B. This prevents electrons from leaving the waveguide region 3. Furthermore, the large band gap results in a low refractive index, which is advantageously small compared to the waveguide layers 3A, 3B. This improves waveguiding in the waveguide region 3.

The p-type cladding layer 6 is followed by a p-contact layer 7 on the side facing away from the active layer 4. The p-contact layer 7 may in particular be a GaN layer or an InGaN layer. The p-contact layer 7 is a p-doped layer, which is advantageously highly doped. The dopant concentration in the p-type cladding layer 7 is advantageously at least $5*10^{19}$ cm$^{-3}$, preferably at least $1*10^2$ cm$^{-3}$. The p-type cladding layer 7 can differ from the p-type cladding layer 6 in particular in that it comprises a higher dopant concentration.

A p-type connection layer 8 is arranged above the p-contact layer 7. Furthermore, the edge-emitting semiconductor laser 100 comprises an n-type connection layer 9, for example on a back side of the substrate 1. The p-type connection layer 8 and the n-type connection layer 9 may comprise, for example, a metal or a metal alloy.

The semiconductor layer sequence 10 includes a layer system 20 which is intended to reduce or preferably completely avoid facet defects in the waveguide region 3. For this purpose, the layer system 20 is arranged outside the waveguide region 3. In the example of FIG. 1, the layer system 20 is arranged between the substrate 1, which is for example a GaN substrate, and the n-type cladding layer 2. Strains are generated in the layer system 20 by varying the material composition, which are suitable to prevent any facet defects that may occur from propagating into adjacent regions of the semiconductor layer sequence 10. The layer system 20 takes advantage of the knowledge that facet defects occur or propagate at interfaces that comprise high strains. In particular, a strain greater than 2 GPa is generated in the layer system 20 by means of the material composition.

Therefore, if a facet defect occurs during a mechanical strain on the semiconductor layer sequence 10, which may occur in particular during the formation of the laser facets by scribing and breaking, it will most likely occur at an interface with high strain in the layer system 20 and/or may be redirected at such an interface with high strain parallel to the interface. Therefore, selectively building up layer strains outside the waveguide region 3 in the layer system 20 can advantageously avoid facet defects in the waveguide region 3.

In the exemplary embodiment of FIG. 1, the layer system comprises an $In_yGa_{1-y}N$ layer 21 following the GaN substrate 1 and an $Al_xGa_{1-x}N$ layer 22. The $In_yGa_{1-y}N$ layer 21 and the $Al_xGa_{1-x}N$ layer 22 are each formed as gradient layers, wherein the indium content y in the growth direction z in the $In_yGa_{1-y}N$ layer 21 increases from y=0 to y=0.05, and wherein the aluminum content x in the growth direction in the $Al_xGa_{1-x}N$ layer 22 decreases from x=0.18 to x=0.

Figure 2:
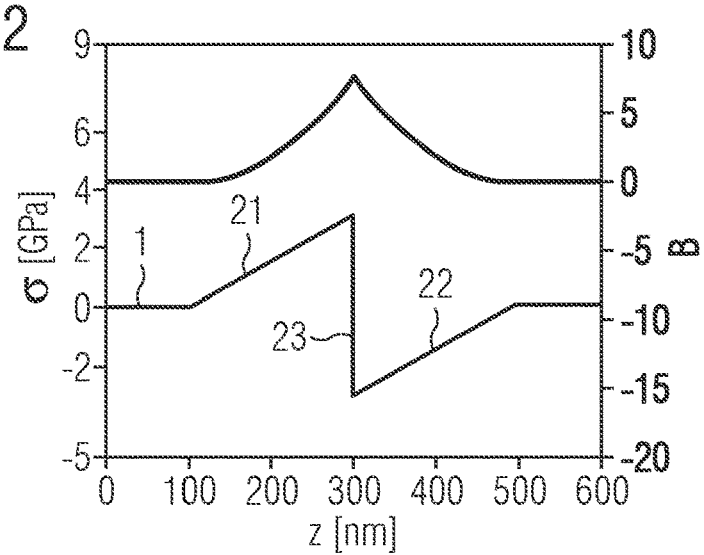
FIGS. 2 to 24 each show a schematic representation of the course of the strain (in each case the lower curve) and the bending B (in each case the upper curve) in the layer system in different exemplary embodiments of the edge-emitting semiconductor laser.

The strain caused by the material composition in the layer system 20, as well as a bending B resulting from such strain, are shown in FIG. 2 as a function of a coordinate z extending in the growth direction. In the diagram of FIG. 2 as well as in the following diagrams, the first 100 nm and the last 100 nm of the diagram each relate to a region outside the layer system 20. In FIG. 2, therefore, the region between z=100 nm and z=500 nm represents the region of the layer system 20.

In the layer system 20 of FIG. 2, the $In_yGa_{1-y}N$ gradient layer 21 is about 200 nm thick, wherein the indium content, which increases in the direction of growth, causes increasing compressive strain and increasing bending B. At the interface 23 to the $Al_xGa_{1-x}N$ layer 22, which is also about 200 nm thick, the high aluminum content x=0.18 causes a change to a tensile strain. The strain and the bending B then decrease again in the growth direction with the falling aluminum content in such a way that after the $Al_xGa_{1-x}N$ layer 22 has grown, a strain=0 and bending B=0 result.

In the layer system, doping of the semiconductor layers 21, 22 can take place in the region of the interface 23 between the adjacent layers 21, 22, for example with Si, Ge, C, O or Mg. A thin doped region at the interface 23, also called a doping spike, can avoid a possible electric voltage drop due to piezoelectric fields at the interface 23.

In general, an indium-containing layer 21 can be used to create a compressive layer strain, and an aluminum-containing layer 22 can be used to create a tensile layer strain. Furthermore, a doping can be used to generate or enhance a layer strain, for example a Si doping can generate a tensile layer strain.

Figure 3:
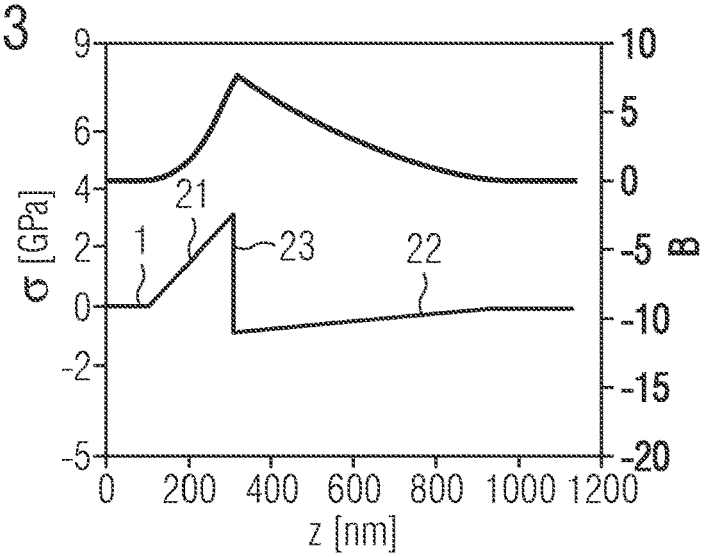

FIG. 3 shows the variation of strain and bending B for another example of the layer system. The layer system comprises an $In_yGa_{1-y}N$ gradient layer 21 following the GaN substrate 1, which is 200 nm thick, wherein the indium fraction increases from y=0 to y=0.05 in the growth direction. An $Al_xGa_{1-x}N$ gradient layer 22 is arranged on top of the $In_yGa_{1-y}N$ gradient layer 21, which is 730 nm thick, wherein the aluminum fraction decreases from x=0.05 to x=0 in the growth direction. The highest strain is present at the interface 23 of layers 21, 22, wherein the total strain is zero.

Figure 4:
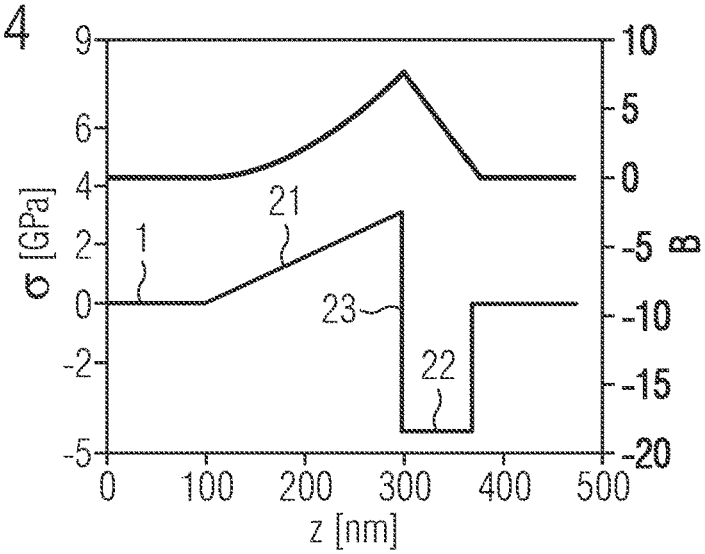

FIG. 4 shows the variation of strain and bending B for another example of the layer system. The layer system comprises an $In_yGa_{1-y}N$ gradient layer 21 following the GaN substrate 1, which is 200 nm thick, wherein the indium fraction increases from y=0 to y=0.05 in the growth direction. An $Al_xGa_{1-x}N$ layer 22 is arranged on the $In_yGa_{1-y}N$ gradient layer 21, which is 72 nm thick, wherein the aluminum fraction is x=0.25. The highest strain is present at the interface 23 of layers 21, 22, wherein the total strain is zero.

Figure 5:
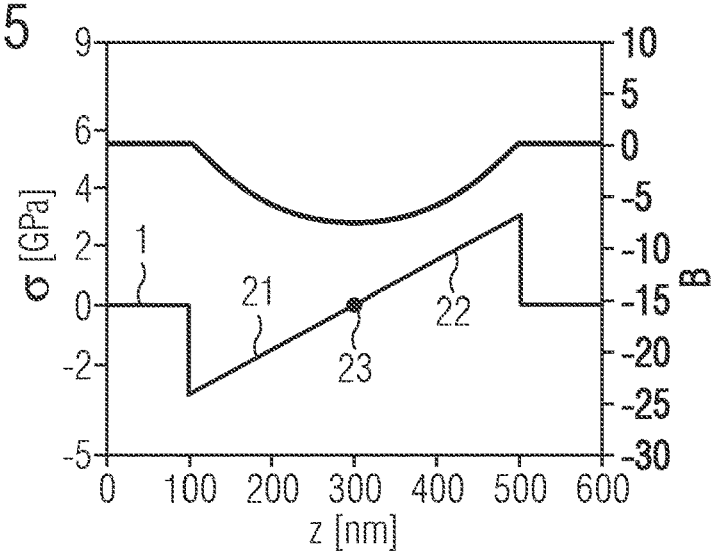

FIG. 5 shows the variation of strain and bending B for another example of the layer system. The layer system comprises an $In_yGa_{1-y}N$ gradient layer 21 following the GaN substrate 1, which is 200 nm thick, wherein the indium fraction drops from y=0.05 to y=0 in the growth direction. An $Al_xGa_{1-x}N$ gradient layer 22 is arranged on top of the $In_yGa_{1-y}N$ gradient layer 21, which is 200 nm thick, wherein the aluminum content increases from x=0 to x=0.18 in the growth direction. At the interface 23 between layers 21, 22, the sign of the layer strain changes, i.e., the layer strain changes from compressive to tensile. The total strain is zero.

Figure 6:
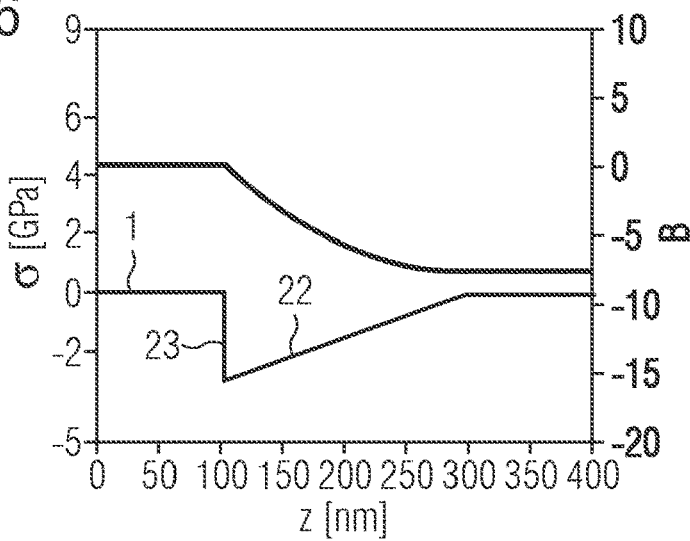

FIG. 6 shows the variation of strain and bending B for another example of the layer system. The layer system comprises an $Al_xGa_{1-x}N$ gradient layer 22 following the GaN substrate 1, which is 200 nm thick, wherein the aluminum fraction drops from x=0.18 to x=0 in the growth direction. The highest strain is present at the interface 23 between the substrate 1 and the $Al_xGa_{1-x}N$ gradient layer 22. In contrast to the previous exemplary embodiments, the total strain of the layer system is not zero, rather the layer system as a whole is tensile strained. Such a tensile total strain can be advantageous when the laser facets are broken from the back side.

Figure 7:
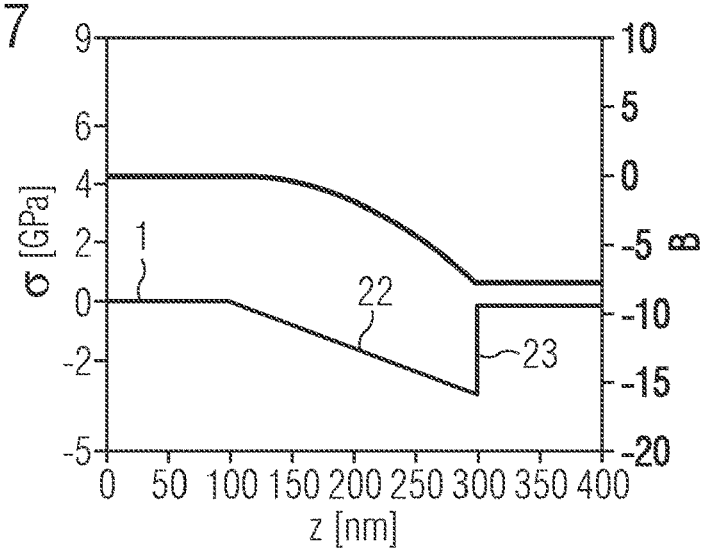

FIG. 7 shows the course of the strain and the bending B for another example of the layer system. The layer system comprises an $Al_xGa_{1-x}N$ gradient layer 22 following the GaN substrate 1, which is 200 nm thick, wherein the aluminum fraction increases from x=0 to x=0.18 in the growth direction. The highest strain is present at an interface 23 of the $Al_xGa_{1-x}N$ gradient layer 22 facing away from the substrate. As in the previous example, the layer system as a whole is tensile strained. Such an overall tensile strain can be advantageous when the laser facets are broken from the back side.

Figure 8:
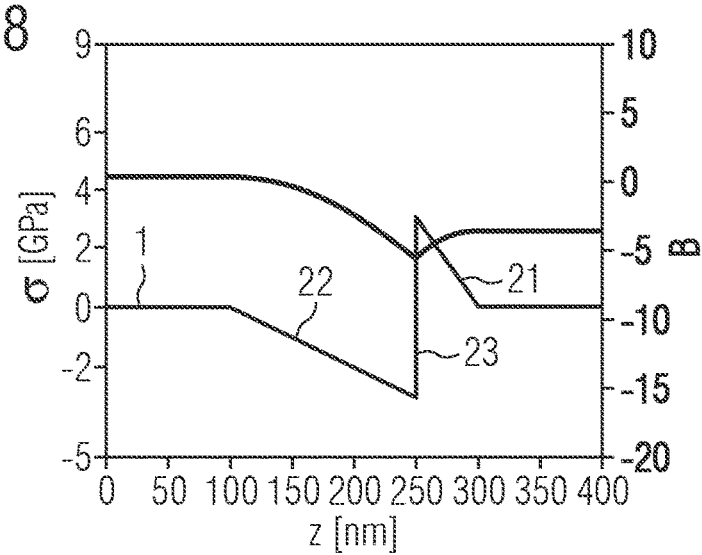

FIG. 8 shows the course of the strain and the bending B in another example of the layer system. The layer system comprises an $Al_xGa_{1-x}N$ gradient layer 22 following the GaN substrate 1, which is 150 nm thick, wherein the aluminum fraction increases from x=0 to x=0.18 in the growth direction. An $In_yGa_{1-y}N$ gradient layer 21 is arranged on the $Al_xGa_{1-x}N$ gradient layer 22, which is 50 nm thick, wherein the indium fraction decreases from y=0.05 to y=0 in the growth direction. The highest strain is present at the interface 23 of layers 21, 22, wherein the layer system as a whole is tensile strained, as in the two previous examples.

Figure 9:
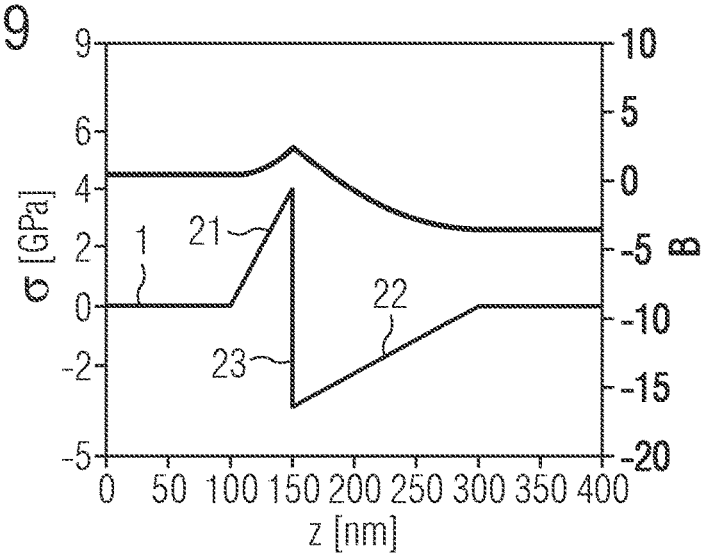

FIG. 9 shows the course of the strain and the bending B for another example of the layer system. The layer system comprises an $In_yGa_{1-y}N$ gradient layer 21 following the GaN substrate 1, which is 50 nm thick, wherein the indium fraction increases from y=0 to y=0.07 in the growth direction. An $Al_xGa_{1-x}N$ gradient layer 22 is arranged on top of the $In_yGa_{1-y}N$ gradient layer 21, which is 150 nm thick, wherein the aluminum fraction decreases from x=0.2 to x=0 in the growth direction. The highest strain is present at the interface 23 of layers 21, 22, wherein the layer system as a whole is tensile strained, as in the three previous examples.

Figure 10:
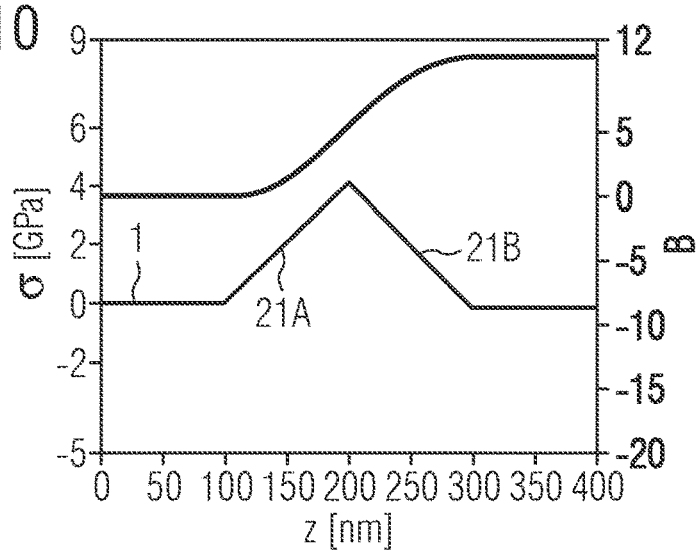

FIG. 10 shows the course of the strain and the bending B for another example of the layer system. The layer system comprises an $In_yGa_{1-y}N$ gradient layer 21A following the GaN substrate 1, which is 100 nm thick, wherein the indium fraction increases from y=0 to y=0.07 in the growth direction. On top of the $In_yGa_{1-y}N$ gradient layer 21A, another one $In_yGa_{1-y}N$ gradient layer 21B is arranged, which is 100 nm thick, wherein the indium content decreases from y=0.07 to y=0 in the growth direction. In contrast to the previous exemplary embodiments, the layer system is overall compressively strained. Such an overall compressive strain can be advantageous when the laser facets are broken from the front side.

Figure 11:
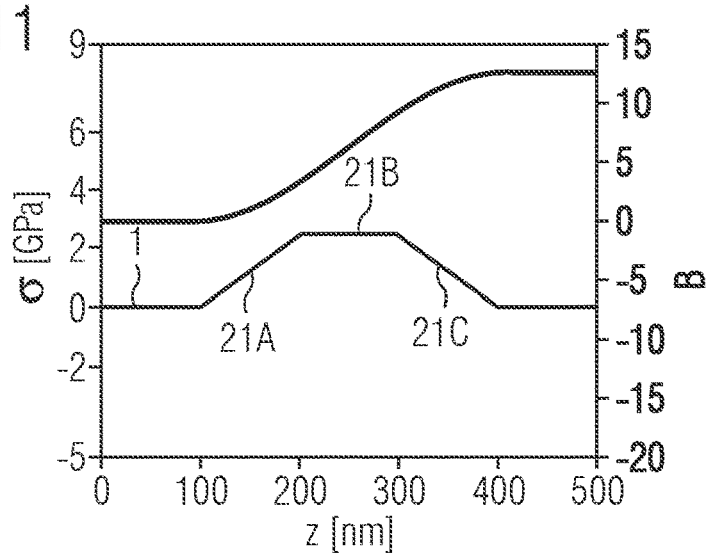

FIG. 11 shows the course of the strain and the bending B in another example of the layer system. The layer system comprises an $In_yGa_{1-y}N$ gradient layer 21A following the GaN substrate 1, which is 100 nm thick, wherein the indium fraction increases from y=0 to y=0.04 in the growth direction. This is followed by an $In_yGa_{1-y}N$ layer 21B, which is 100 nm thick, with a constant indium fraction y=0.04. On top of the $In_yGa_{1-y}N$ layer 21B, an $In_yGa_{1-y}N$ gradient layer 21C is arranged, which is 100 nm thick, wherein the indium fraction decreases from y=0.04 to y=0 in the growth direction. As in the previous example, the layer system as a whole is compressively strained.

Figure 12:
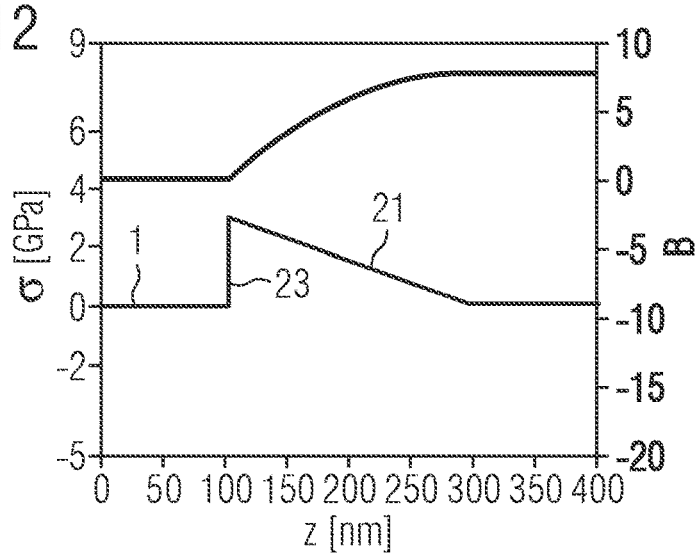

FIG. 12 shows the variation of strain and bending B for another example of the layer system. The layer system comprises an $In_yGa_{1-y}N$ gradient layer 21 following the GaN substrate 1, which is 200 nm thick, wherein the indium fraction decreases from y=0.05 to y=0 in the growth direction. The highest strain is present at the interface 23 between the substrate 1 and the $In_yGa_{1-y}N$ gradient layer 21. As in the previous example, the layer system as a whole is compressively strained.

Figure 13:
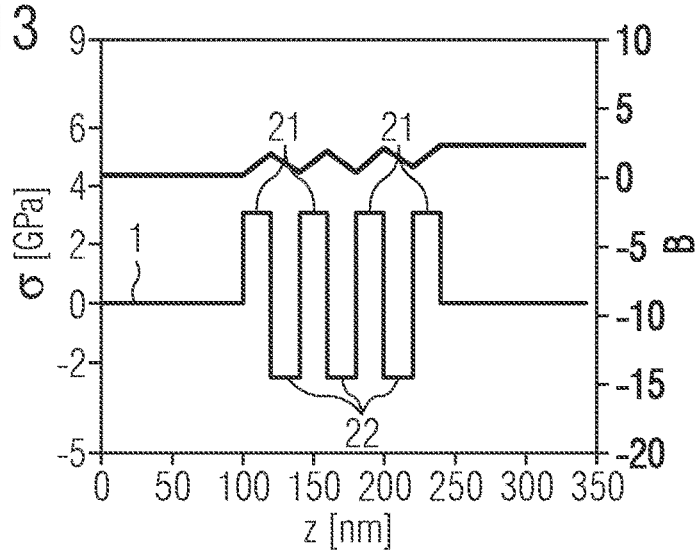
Figure 14:
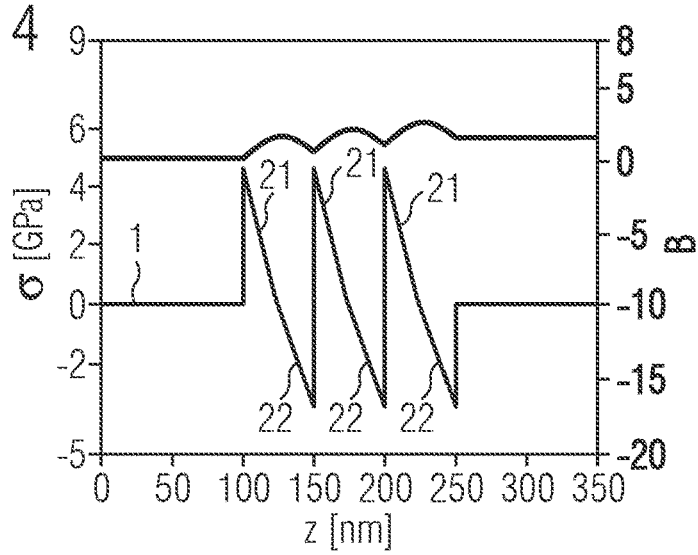
Figure 15:
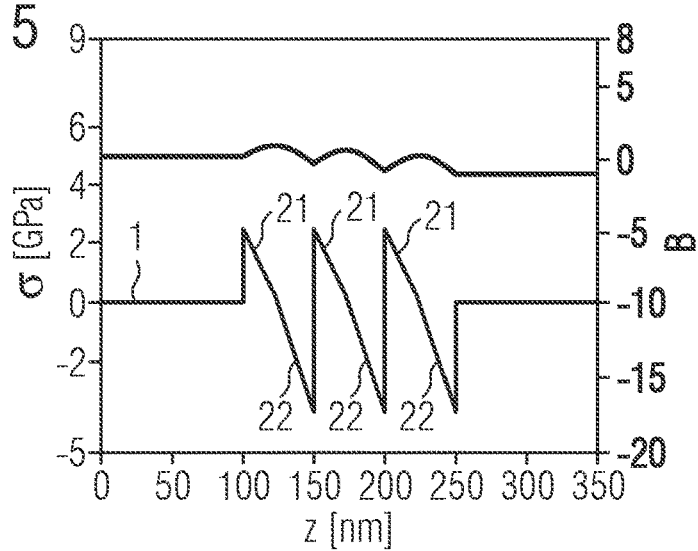

FIGS. 13, 14 and 15 show the variation of strain and bending B in other examples of the layer system, each comprising a superlattice structure of alternating $In_yGa_{1-y}N$ layers 21 and $Al_xGa_{1-x}N$ layers 22. In the example of FIG. 13, the layer system has alternating $In_yGa_{1-y}N$ layers 21, which are 20 nm thick and comprise an indium portion y=0.05, and $Al_xGa_{1-x}N$ layers 22, which are 20 nm thick and comprise an aluminum portion x=0.15. In the example of FIG. 14, the layer system alternately comprises $In_yGa_{1-y}N$ gradient layers 21, which are 25 nm thick and comprise an indium fraction decreasing from y=0.08 to y=0, and $Al_xGa_{1-x}N$ gradient layers 22, which are 25 nm thick and comprise an aluminum fraction increasing from x=0 to x=0.2. In the example of FIG. 15, the layer system alternately comprises $In_yGa_{1-y}N$ gradient layers 21, which are 25 nm thick and comprise an indium fraction decreasing from y=0.04 to y=0, and $Al_xGa_{1-x}N$ gradient layers 22, which are 25 nm thick and comprise an aluminum fraction increasing from x=0 to x=0.22. Superlattice structures have the advantage of comprising a large number of interfaces that can prevent potential facet defects from propagating.

Figure 16:
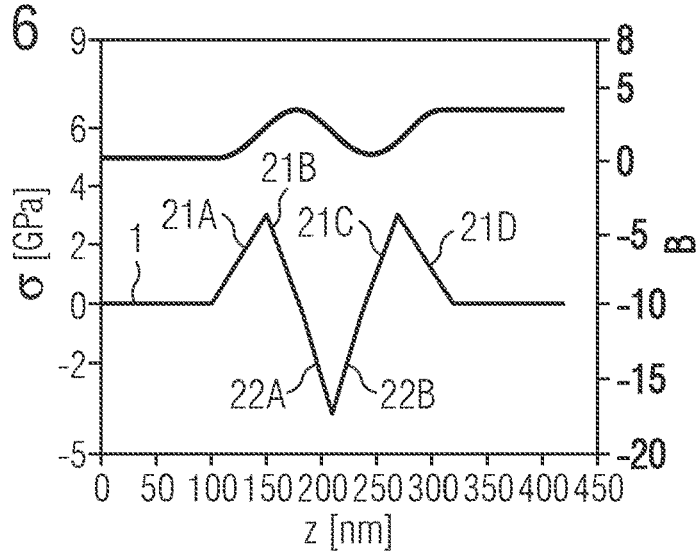
Figure 17:
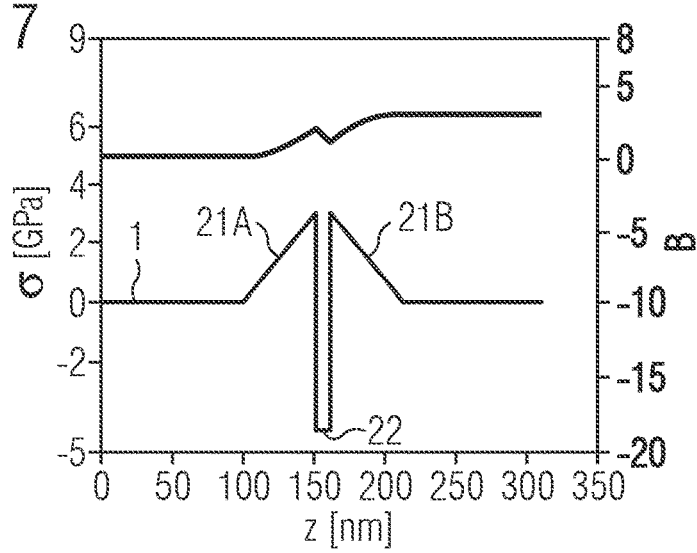
Figure 18:
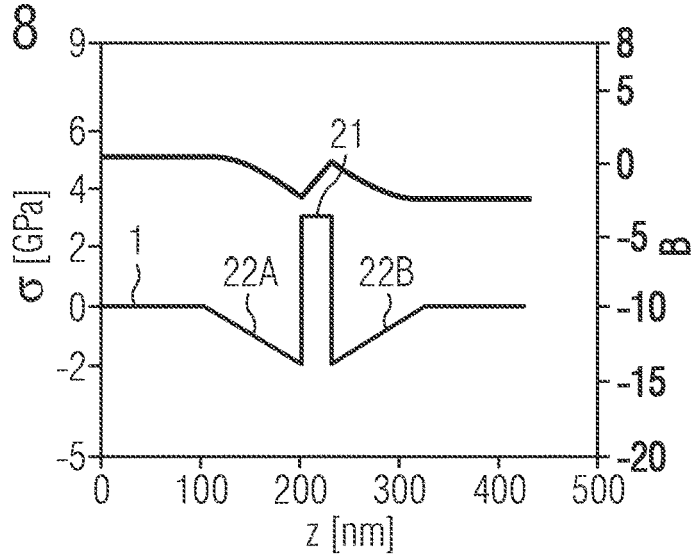

The following FIGS. 16, 17 and 18 show the course of the strain and the bending B in further examples of the layer system, in which in each case two interfaces with high strain are close to each other, so that facet defects in a defined area as small as possible are prevented from propagating.

In the example of FIG. 16, the layer system, starting from the GaN substrate 1, comprises a 50 nm thick $In_yGa_{1-y}N$ gradient layer 21A with an indium fraction increasing in the growth direction from y=0 to y=0.05, a 30 nm thick $In_yGa_{1-y}N$ gradient layer 21B having an indium content decreasing in the growth direction from y=0.05 to y=0, a 30 nm thick $Al_xGa_{1-x}N$ gradient layer 22A having an aluminum content increasing in the growth direction from x=0 to x=0, 22 increasing aluminum content, a 30 nm thick $Al_xGa_{1-x}N$ gradient layer 22B with aluminum content decreasing in the growth direction from x=0.22 to x=0, a 30 nm thick $In_yGa_{1-y}N$ gradient layer 21C having an indium portion increasing in the growth direction from y=0 to y=0.05, and a 50 nm thick $In_yGa_{1-y}N$ gradient layer 21D having an indium portion decreasing in the growth direction from y=0.05 to y=0.

In the example of FIG. 17, starting from the GaN substrate 1, the layer system comprises a 50 nm thick $In_yGa_{1-y}N$ gradient layer 21A with an indium fraction increasing in the growth direction from y=0 to y=0.05, a 10 nm thick $Al_xGa_{1-x}N$ layer 22 with an aluminum fraction x=0.25 and a 50 nm thick $In_yGa_{1-y}N$ gradient layer 21B with an indium fraction decreasing in the growth direction from y=0.05 to y=0.

In the example of FIG. 18, starting from the GaN substrate 1, the layer system comprises a 100 nm thick $Al_xGa_{1-x}N$ gradient layer 22A with an aluminum portion increasing in the growth direction from x=0 to x=0.12, a 30 nm thick $In_yGa_{1-y}N$ layer 21 with an indium portion y=0.05, and a 100 nm thick $Al_xGa_{1-x}N$ gradient layer 22B with an aluminum portion decreasing in the growth direction from x=0.12 to x=0.

Figure 19:
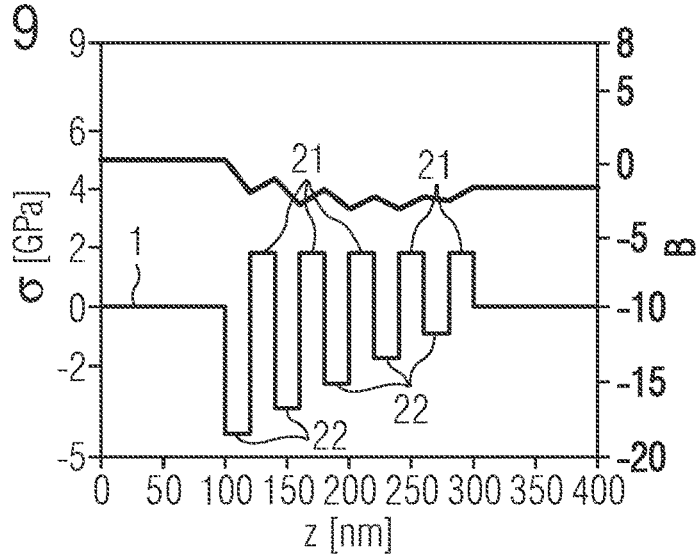
Figure 20:
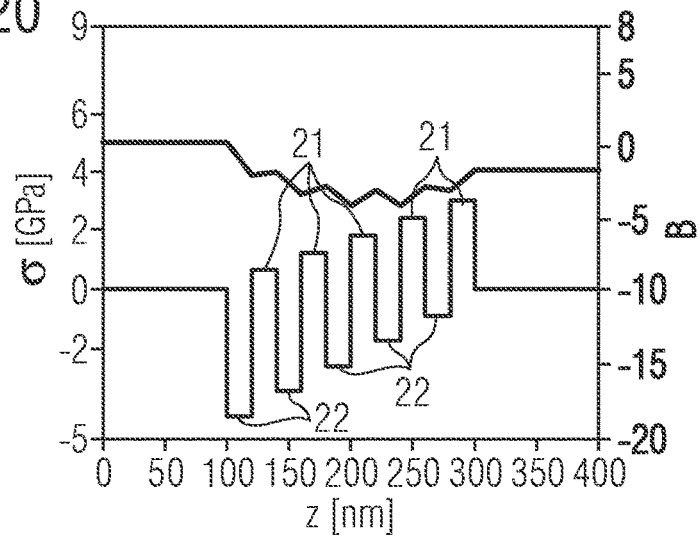
Figure 21:
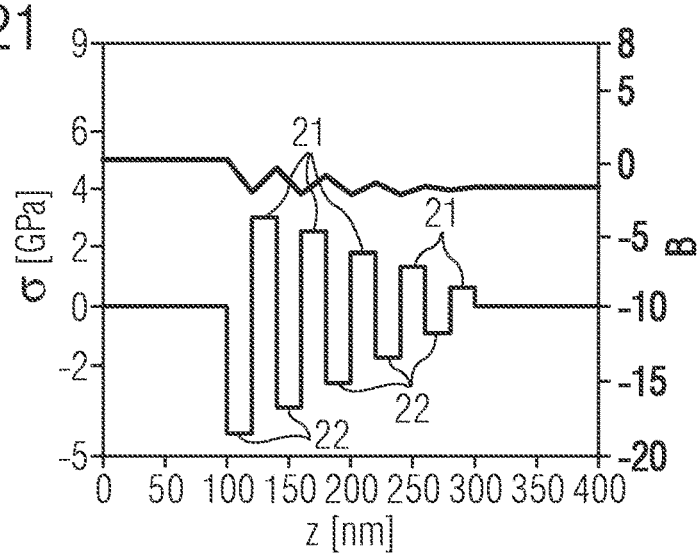

The following FIGS. 19, 20 and 21 show the variation of strain and bending B for further examples of the layer system, each comprising alternating $Al_xGa_{1-x}N$ layers 22 and $In_yGa_{1-y}N$ layers 21. In the example of FIG. 19, the aluminum content of the $Al_xGa_{1-x}N$ layers 22 decreases from layer to layer, while the $In_yGa_{1-y}N$ layers 21 each comprise the same indium content. In the example of FIG. 20, the aluminum content of the $Al_xGa_{1-x}N$ layers 22 decreases from layer to layer, and the indium content of the $In_yGa_{1-y}N$ layers 21 increases from layer to layer. In the example of FIG. 21, both the aluminum content of the $Al_xGa_{1-x}N$ layers 22 and the indium content of the $In_yGa_{1-y}N$ layers 21 decrease from layer to layer.

Figure 22:
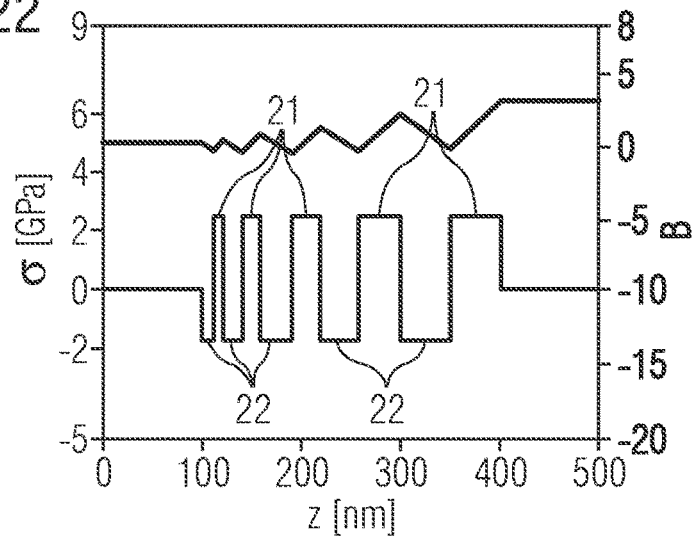
Figure 23:
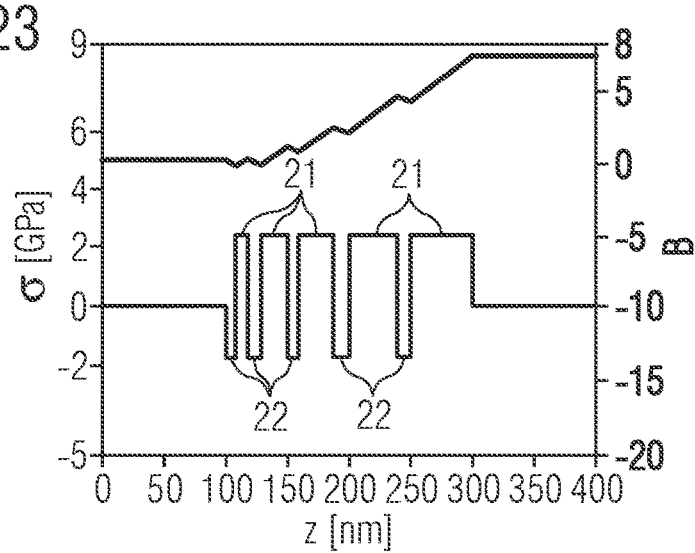
Figure 24:
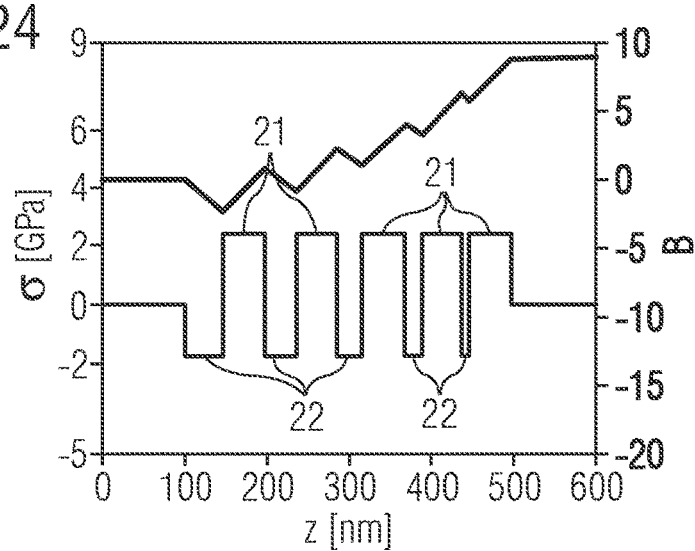

FIGS. 22, 23 and 24 show the variation of strain and bending B in further examples of the layer system, each comprising alternating $Al_xGa_{1-x}N$ layers 22 and $In_yGa_{1-y}N$ layers 21. In these examples, the $Al_xGa_{1-x}N$ layers 22 each comprise the same aluminum content and the $In_yGa_{1-y}N$ layers 21 each comprise the same indium content. In the layer systems, however, the thickness of the $Al_xGa_{1-x}N$ layers 22 and $In_yGa_{1-y}N$ layers 21 varies.

Figure 25:
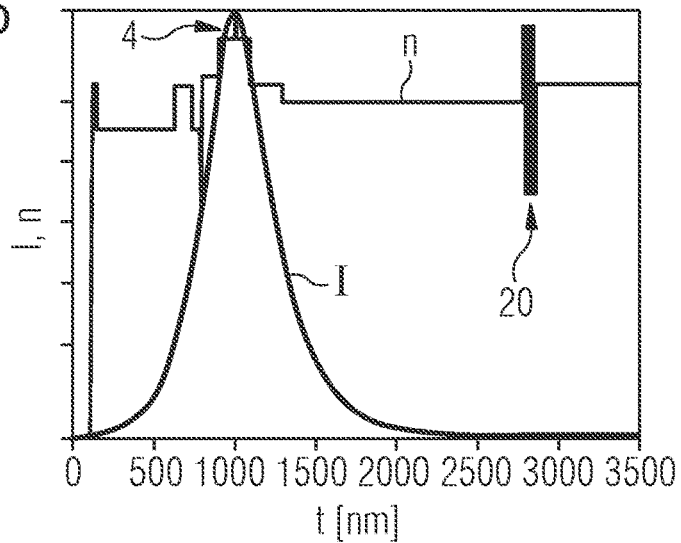
FIG. 25 shows the course of the intensity I of the laser radiation and the refractive index n in the semiconductor layer sequence in an exemplary embodiment of the edge-emitting semiconductor laser.

FIG. 25 shows schematically the course of the intensity I of the laser radiation and the refractive index n (both in arbitrary units) in an exemplary embodiment of the edge-emitting semiconductor laser as a function of a depth t measured from the surface. The laser radiation comprises the maximum intensity in the active region 4. At the location of the layer system 20, the intensity is less than 20%, preferably less than 10% and particularly preferably only less than 5% of the maximum intensity. This can be achieved in particular by a sufficiently large distance between the layer system 20 and the active layer 4, wherein the distance is at least 500 nm, preferably at least 1 µm.

Figure 26:
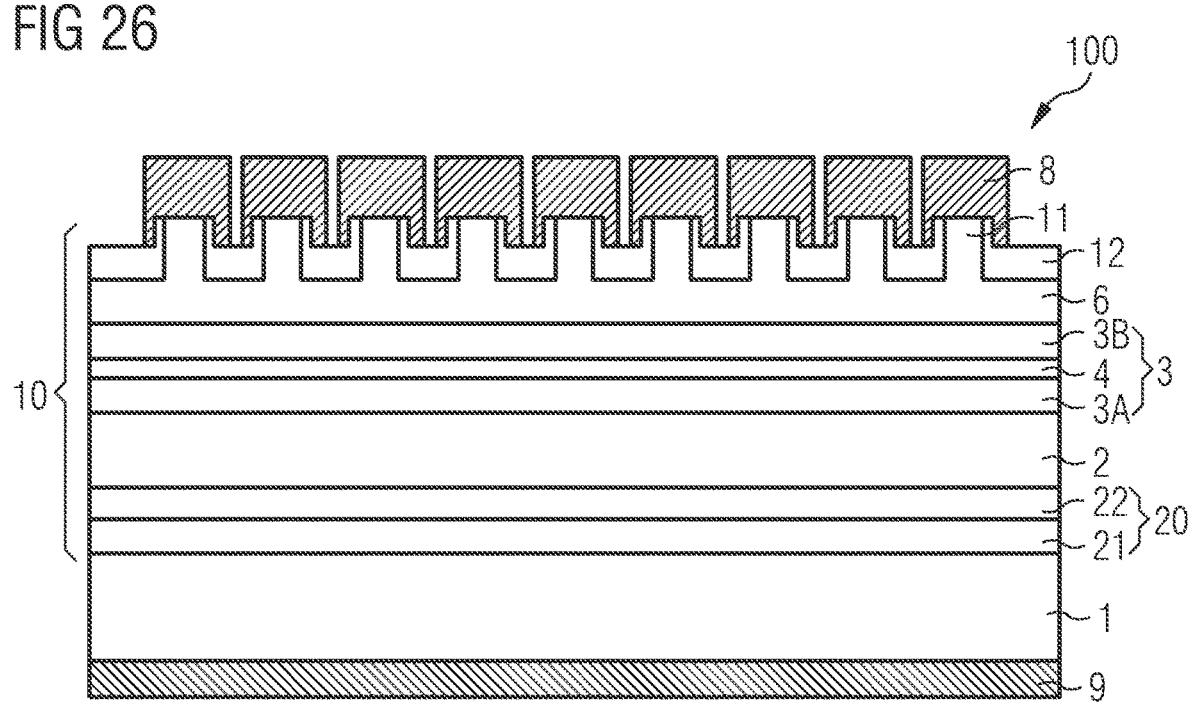
FIG. 26 shows a schematic representation of a cross-section through an edge-emitting semiconductor laser according to a further exemplary embodiment.

FIG. 26 schematically shows another exemplary embodiment of the edge-emitting semiconductor laser 100 in cross-section. The arranging of the layers of the semiconductor layer sequence 10 corresponds to the example of FIG. 1 and is therefore not explained in detail again. The difference from the example of FIG. 1 is that the edge-emitting semiconductor laser 100 shown here is a laser bar which comprises a plurality of emitters arranged side by side. A plurality of side-by-side ridge waveguides 11 are formed on the surface of the laser bar, on each of which a p-type connection layer 8 is arranged. The p-type connection layers 8 each contact the upper side of the ridge waveguides 11 and are otherwise electrically isolated from the semiconductor layer sequence 10 by a passivation layer 12. The layer system 20 for reducing facet defects in the waveguide region 3 may be arranged between the substrate 1 and the n-type cladding layer 2, for example, as in the exemplary embodiment of FIG. 1. The layer system 20 for reducing facet defects is particularly advantageous in a laser bar, since facet defects of a single emitter may lead to failure of the entire laser bar.

The invention is not limited by the description based on the exemplary embodiments. Rather, the invention encompasses any new feature as well as any combination of features, which particularly includes any combination of features in the claims, even if that feature or combination itself is not explicitly specified in the claims or exemplary embodiments.

The invention claimed is:

1. An edge-emitting semiconductor laser comprising:
a semiconductor layer sequence comprising:
a waveguide region with an active layer disposed between a first waveguide layer and a second waveguide layer; and
a layer system arranged outside the waveguide region configured to reduce facet defects in the waveguide region,
wherein the layer system comprises one or more layers with the material composition $Al_xIn_yGa_{1-x-y}N$ with $0 \leq x \leq 1$, $0 \leq y < 1$ and $x+y \leq 1$,
wherein at least one layer of the layer system comprises an aluminum portion $x \geq 0.05$ or an indium portion $y \geq 0.02$,
wherein a layer strain is at least 2 GPa at least in some areas,
wherein the layer system comprises at least one $Al_xIn_yGa_{1-x-y}N$ layer comprising a gradient of at least one of the indium portion or the aluminum portion, and
wherein the semiconductor layer sequence is based on a nitride compound semiconductor material.

2. The edge-emitting semiconductor laser according to claim 1, wherein the one or more layers have a thickness of at least 10 nm.

3. The edge-emitting semiconductor laser according to claim 1, wherein a distance between the layer system and the active layer is at least 500 nm.

4. The edge-emitting semiconductor laser according to claim 1, wherein a distance between the layer system and the active layer is at least 1 µm.

5. The edge-emitting semiconductor laser according to claim 1, wherein a laser radiation propagating in the waveguide region comprises a maximum intensity $I_{max}$, and wherein an intensity of the laser radiation in the layer system is not more than $0.2*I_{max}$.

6. The edge-emitting semiconductor laser according to claim 1, wherein the waveguide region is arranged between an n-type cladding layer and a p-type cladding layer, and wherein the layer system is arranged between a substrate of the edge-emitting semiconductor laser and the n-type cladding layer.

7. The edge-emitting semiconductor laser according to claim 1, wherein the layer system comprises at least one $Al_xIn_yGa_{1-x-y}N$ layer having an indium content $y \geq 0.03$.

8. The edge-emitting semiconductor laser according to claim 1, wherein the layer system comprises at least one $Al_xIn_yGa_{1-x-y}N$ layer comprising an aluminum portion $x \geq 0.1$.

9. The edge-emitting semiconductor laser according to claim 1, wherein the layer system comprises at least one $In_yGa_{1-y}N$ layer configured to generate a compressive strain and at least one $Al_xGa_{1-x}N$ layer configured to generate a tensile strain.

10. The edge-emitting semiconductor laser according to claim 9, wherein the $In_yGa_{1-y}N$ layer and the $Al_xGa_{1-x}N$ layer are directly adjacent to each other.

11. The edge-emitting semiconductor laser according to claim 1, wherein the layer strain in the layer system is at least regionally larger than in the waveguide region.

12. The edge-emitting semiconductor laser according to claim 1, wherein the layer system comprises at least one interface at which the layer strain changes by more than 2 GPa.

13. The edge-emitting semiconductor laser according to claim 1, wherein the layer system comprises at least one interface at which the layer strain changes from compressive strain to tensile strain or from tensile strain to compressive strain.

14. The edge-emitting semiconductor laser according to claim 1, wherein the layer system comprises a plurality of alternating InGaN layers and AlGaN layers.

15. The edge-emitting semiconductor laser according to claim 1, wherein the layer system comprises at least 3 and at most 100 layers.

16. The edge-emitting semiconductor laser according to claim 1, further comprising a first laser facet and a second laser facet, wherein the first laser facet and the second laser facet do not comprise the facet defects in the waveguide region.

17. The edge-emitting semiconductor laser according to claim 1, further comprising a first laser facet and a second laser facet, wherein the first laser facet or the second laser facet comprises the facet defects in the layer system.

18. The edge-emitting semiconductor laser according to claim 1, wherein the edge-emitting semiconductor laser is a laser bar comprising a plurality of emitters arranged side by side.

19. The edge-emitting semiconductor laser according to claim 1, wherein the layer system is adjacent to a GaN layer, and wherein a bending induced by the entire layer system is zero.

* * * * *